United States Patent [19]

Tran

[11] Patent Number: 4,814,647
[45] Date of Patent: Mar. 21, 1989

[54] FAST RISE TIME BOOTING CIRCUIT
[75] Inventor: Hiep V. Tran, Carrollton, Tex.
[73] Assignee: Texas Instruments Incorporated, Dallas, Tex.
[21] Appl. No.: 34,378
[22] Filed: Apr. 6, 1987
[51] Int. Cl.[4] .................... H03K 4/58; H03K 17/687; H03K 19/017; H03K 17/04
[52] U.S. Cl. .................................. 307/482; 307/578; 307/530; 307/585; 365/203; 365/226
[58] Field of Search ............... 307/482, 578, 449, 463, 307/270, 475, 451, 601, 603, 264, 530, 585; 328/172, 173, 176; 365/203, 104, 194, 226, 227

[56] References Cited
U.S. PATENT DOCUMENTS

| | | | |
|---|---|---|---|
| 4,398,100 | 8/1983 | Tobita et al. | 307/482 X |
| 4,533,843 | 8/1985 | McAlexander III et al. | 307/530 |
| 4,543,500 | 9/1985 | McAlexander III et al. | 307/530 |
| 4,574,203 | 3/1986 | Baba | 307/482 X |
| 4,689,495 | 8/1987 | Liu | 307/482 X |
| 4,692,638 | 9/1987 | Stiegler | 307/482 X |
| 4,716,303 | 12/1987 | Mimoto | 307/482 X |

FOREIGN PATENT DOCUMENTS 53-003747 1/1978 Japan .................................. 307/578

Primary Examiner—Stanley D. Miller
Assistant Examiner—David R. Bertelson
Attorney, Agent, or Firm—Stanton C. Braden; James T. Comfort; Melvin Sharp

[57] ABSTRACT

A circuit is disclosed for generating a two-stage boot signal, the first stage being a transition from a low voltage to a high voltage, and the second stage being a transition from the high voltage to an increased high voltage. The first stage operates to read the contents from a memory cell, and the second stage operates to restore the contents of the access memory cell. A capacitor (102) is charged with a voltage to boost the output (122) of the circuit (52) in order to produce the increased high voltage. However, the lower plate (100) of the capacitor (102) is effectively disconnected from the circuit during the transition from a low to high voltage in order to provide a fast transition period.

18 Claims, 2 Drawing Sheets

FAST RISE TIME BOOTING CIRCUIT

TECHNICAL FIELD OF THE INVENTION

This invention pertains generally to dynamic memories, and more particularly to a method and apparatus for reducing the access time necessary to read data from a dynamic memory.

BACKGROUND OF THE INVENTION

Dynamic RAM circuits commonly use a circuit known as a "booting circuit" to drive their wordlines in order to improve the DRAM performance. For example, U.S. Pat. No. 4,543,500 and 4,533,843 to McAlexander et al. contain disclosures of the advantages of booting the wordline of a DRAM above the supply voltage. Such booting circuits commonly produce a signal having two stages. In the first stage, the signal rises from a low voltage (ground) to a high voltage (the power supply voltage or "$V_{cc}$"). When the signal reaches a threshold voltage $V_{read}$, data from the DRAM cell addressed by the wordline may be read. It is desirable that the booting signal reach $V_{read}$ as quickly as possible in order to have a fast memory access time.

In the second stage of the signal, the signal is "booted" or "boosted" above $V_{cc}$ in order to fully restore the charge into the DRAM cell which was previously read. As taught by U.S. Pat. Nos. 4,533,843 and 4,543,500, to fully charge the cell, it is necessary to supply a voltage higher than $V_{cc}$.

In previously developed booting circuits, an input signal undergoing a low to high transition is passed from the input to the output of the booting circuit, where it is used to generate the signal for the first stage. In such circuits, as the input signal is being passed to the output, a capacitor connected to the output is being charged by the output voltage. Subsequently, the charge stored in the capacitor is used to "boot" the output signal. Since the input signal is being used to charge the capacitor, the output signal for the first stage will be sloping, rather than being an abrupt low to high transition. Consequently, the time taken for the output signal to reach $V_{read}$ is increased relative to the input signal, and hence, the memory access time is often excessive in previously developed booting circuits.

Therefore, the need has arisen for a booting circuit having an output signal with a fast rising transition in order to produce faster memory access times.

SUMMARY OF THE INVENTION

The present invention disclosed and claimed herein describes a method and apparatus for driving the wordline of a dynamic memory which substantially eliminates problems associated with prior wordline driving circuits.

In one aspect of the invention, a circuit for driving a wordline of a memory is disclosed in which an input signal is passed to the output node as it rises from a low voltage state to a high voltage state. A capacitor having a first plate connected to the output node has its second plate effectively disconnected from the remainder of the circuit during the upward voltage transition of the output node in order to prevent loading of the output node, which would decrease the rate of transition. After the output node reaches a level at which the memory cell can be read, the second plate of the capacitor is connected to ground in order to develop a charge across its plates. Subsequently, a voltage is applied to the second plate, causing an increased voltage at the output node. The increased voltage at the output node allows the full restoration of data in the memory cell from which the data was read.

One aspect of the present invention thus provides the technical advantages of producing a fast rising output signal during the low to high transition by effectively disconnecting the capacitor during the low to high transition. Another aspect of the present invention provides the advantage of charging the capacitor after a predetermined output voltage is reached, at a rate such that the charging does not reduce the output voltage below the minimum voltage necessary to read the contents of a memory cell.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

The preferred embodiment of the present invention is best understood by referring to FIGS. 1-4 of the drawings, like numerals being used for like and corresponding parts of the various drawings.

Figure 1:
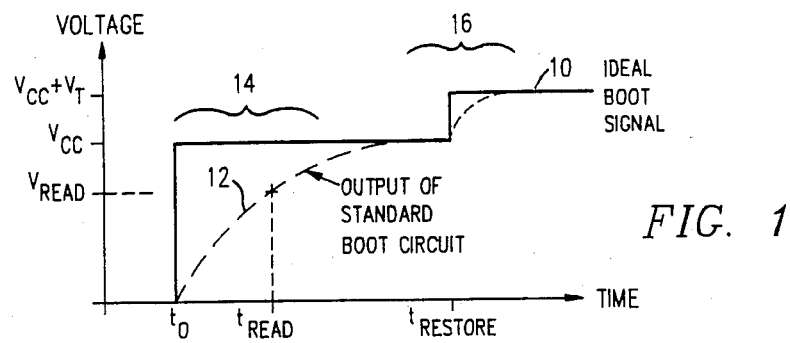
FIG. 1 illustrates an ideal output signal for driving a wordline in comparison with the output of a typical prior boot circuit.

Referring to FIG. 1, a graph of an ideal output signal 10 used to drive the wordline of a dynamic RAM is illustrated in comparison with an output signal 12 obtainable using a standard prior art boot circuit. The ideal output signal 10 has two stages: a "read" stage 14, and a "boot" stage 16. In the read stage 14, the output signal undergoes a low to high transition beginning at $t_O$. At the point where the voltage of the output signal equals $V_{read}$, the contents of a particular memory cell may be read. In typical DRAM circuits, $V_{read}$ is approximately equal to half of the power supply voltage plus the threshold voltage of the memory cell connected to the wordline. In the ideal output signal 10, the voltage instantaneously rises from low to high at time $t_O$. Hence, for the ideal output signal 10, $t_{read}$ occurs at time $t_O$. Similarly, in the boot stage 16, the ideal output signal 10 is boosted one or two volts above $V_{cc}$ at time $t_{restore}$, as is described in U.S. Pat. Nos. 4,533,843 and 4,543,500 which are incorporated by reference herein.

Figure 2:
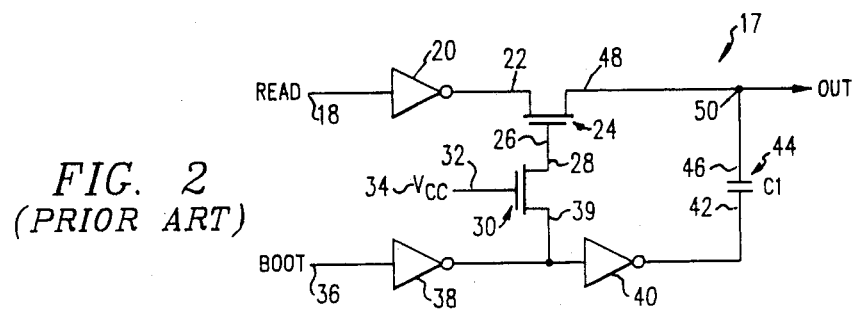
FIG. 2 illustrates a standard prior boot circuit used to generate an output signal for driving a wordline.

Referring now to FIG. 2, a typical prior art boot circuit 17 for approximating the ideal output signal 10 is illustrated. A read signal 18, which indicates the beginning of the read stage 14, is input to a inverter 20. The output of the inverter 20 is connected to the source 22 of an N-channel transistor 24. The gate 26 of the N-channel transistor 24 is connected to the drain 28 of a N-channel transistor 30. The gate 32 of the N-channel transistor 30 is connected to the power supply, $V_{cc}$ 34. A boot signal 36 indicating the beginning of the boot stage 16 is connected to an inverter 38 whose output is connected to the source 39 of the N-channel transistor 30 and to the input of another inverter 40. The output of the inverter 40 is connected to a lower plate 42 of a capacitor 44. The upper plate 46 of the capacitor 44 is connected to the drain 48 of the N-channel transistor 24. An output node 50 is connected to the upper plate 46 and the drain 48.

The standard boot circuit 17 is designed to begin the read stage 14 on a high to low transition of the read signal 18. Similarly, on a low to high transition of the boot signal 36, the boot stage 16 is implemented. Prior to time $t_O$, the read signal 18 will be high and the boot signal 36 will be low. With the boot signal 36 low, the output of the inverter 38 is high, and hence a high signal is being passed through the N-channel transistor 30 to the gate 26 of the N-channel transistor 24, putting the N-channel transistor 24 in a conducting state. Also, the voltages at the lower plate 42 and the upper plate 46 of the capacitor 44 are both in a low voltage state. At time $t_O$, the read signal 18 changes from high to low, and hence the output of the inverter 20 changes from low to high. With the gate 26 of the N-channel transistor 24 high, the output of the inverter 20 is passed through to the drain 48 of the N-channel transistor 24. Thus, after $t_O$, the voltage at the drain 48, and the upper plate 46, will rise from low to high. Since the lower plate 42 is being held at a low voltage by the inverter 40, the capacitor 44 will oppose this change in voltage between its terminals as the capacitor 44 is charged by the voltage differential. Hence, the capacitor 44 will inhibit the rise in voltage from low to high at the output node 50 as a voltage charge develops across its plates 42 and 46. As illustrated in FIG. 1, this inhibiting effect will result in a sloping rise of the standard boot signal 12 during the read stage 14 rather than a sharp upward voltage rise. Therefore, the voltage $V_{read}$ will not be reached until time $t_{read}$.

After the output node 50 reaches a high voltage level, the boot signal 36 is switched from low to high to implement the boot stage 16. As the boot signal 36 rises from low to high, the output of the inverter 40 also rises from low to high. Since the capacitor 44 will attempt to maintain the voltage differential between its plates, the voltage rise at its lower plate 42 will create a voltage rise at its upper plate 46, thus boosting the voltage at the output node 50. Also, as the booting signal rises from low to high, the N-channel transistor 24 is turned off, thus isolating output node 50 from the output of inverter 20, and allowing the read signal 18 to return to a low voltage without affecting the voltage at the output node 50.

Figure 3:
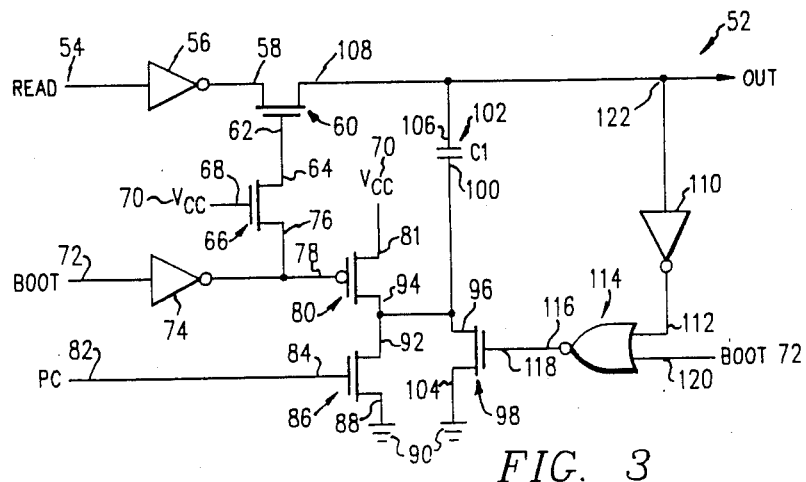
FIG. 3 illustrates the high speed boot circuit of the present invention used to generate an output signal for driving a wordline.

Referring now to FIG. 3, the high speed boot circuit 52 of the present invention is illustrated. A read signal 54 is input to a inverter 56 whose output is connected to the source 58 of a N-channel transistor 60. The gate 62 of the N-channel transistor 60 is connected to the drain 64 of a N-channel transistor 66. The gate 68 of the N-channel transistor 66 is connected to $V_{cc}$ 70. A boot signal 72 is input to an inverter 74. The output of inverter 74 is connected to the source 76 of the N-channel transistor 66 and to the gate 78 of a P-channel transistor 80. The source 81 of the P-channel transistor 80 is connected to $V_{cc}$ 70. A pre-charge signal 82 (hereinafter "PC signal") is connected to the gate 84 of a N-channel transistor 86.

The source 88 of the N-channel transistor 86 is connected to ground 90 and the drain 92 of the N-channel transistor 86 is connected to the drain 94 of the P-channel transistor 80, the drain 96 of a N-channel transistor 98 and to the lower plate 100 of a capacitor 102. The source 104 of the N-channel transistor 98 is connected to ground 90. The upper plate 106 of the capacitor 102 is connected to the drain 108 of the N-channel transistor 60 and to the input of an inverter 110. The output of the inverter 110 is connected to a first input 112 of a NOR gate 114. The output 116 of the NOR gate 114 is connected to the gate 118 of the N-channel transistor 98. The second input 120 of the NOR gate 114 is connected to the boot signal 72. The output node 122 is connected to the input to the inverter 110, the upper plate 106 of the capacitor 102 and the drain 108 of the N-channel transistor 60.

Prior to $t_O$, the read signal 54 is high, the boot signal 72 is low and the PC signal 82 is low. Thus, the voltage at the output node 122 is low, which causes the first input 112 of the NOR gate 114 to be high. Consequently, the output 116 of the NOR gate 114 will be low, and hence, the N-channel transistor 98 will not conduct. Since the boot signal 72 is low, the gate 62 of the N-channel transistor 60 is high, causing the N-channel transistor 60 to be turned on. Prior to $t_O$, the PC signal 82 is temporarily switched to high, causing the N-channel transistor 86 to be turned on. As a result, the lower plate 100 of the capacitor 102 is discharged to ground 90. The PC signal 82 returns to a low value prior to $t_O$.

At time $t_O$, the capacitor 102 is effectively disconnected at its lower plate 100, since N-channel transistors 98 and 86 and P-channel transistor 80 are in non-conducting states. As the read signal 54 switches from a high to a low state, the signal at the source 58 of the N-channel transistor 60 switches from low to high. Since the boot signal 72 is low, the output of the inverter 74 is high; consequently the signal at the gate 62 of the N-channel transistor 60 is also high, allowing the signal to pass from the source 58 to the drain 108 of the N-channel transistor 60.

In the standard boot circuit 12 of FIG. 2, the capacitor 44 resisted this change in voltage, causing a sloped rise in voltage at the drain 48 of the N-channel transistor 24. However, in the high speed boot circuit 52 of FIG. 3, the lower plate 100 of the capacitor 102 is effectively disconnected from the rest of the circuit. Consequently, rather than resisting a change of voltage at the upper plate 106, the lower plate 100 rises in voltage along with the upper plate 106. This aspect of the invention produces the technical advantage that the output node 122 of the high speed booting circuit 52 rises much more quickly in response to a high-to-low transition of the read signal 54, since the capacitor 102 is not being charged during the transition period.

The low to high transition of the drain 108 of the N-channel transistor 60 propagates through the inverter 110, causing a low voltage signal at the first input 112 of the NOR gate 114. With both inputs 112 and 114 low, the output 116 of the NOR gate 114 switches from low to high. As a result, the gate 118 of the N-channel transistor 98 is high, causing the N-channel transistor 98 to conduct between source 104 and drain 96. As the N-channel transistor 98 conducts, the charge at the lower plate 100 is drained to ground 90.

The rate at which the lower plate 100 of the capacitor 102 is discharged may be controlled by the size of the N-channel transistor 98. By adjusting the channel width of the N-channel transistor 98, the amount of current which the transistor will conduct can be controlled. Preferably, the lower plate 100 is discharged relatively evenly over the time period between t*$_{read}$ and t*$_{restore}$, so as to minimize effect of the capacitor 102 on the voltage at the output node 122. This aspect of the invention produces the advantage of gradually charging the capacitor 102, such that the voltage level of the output 122 is not pulled below V$_{read}$.

As the lower plate 100 of the capacitor 102 is pulled low, the rise of the output node 122 becomes somewhat sloped. However, by the time the high signal has propagated through the inverter 110 and the NOR gate 114 and turned the N-channel transistor 98 on, the output node 122 has already surpassed V$_{read}$ and the memory cell is capable of being read. By pulling the lower plate 100 low after reaching V$_{read}$, the capacitor 102 becomes charged with V$_{cc}$ across its plates 100 and 106.

Importantly, the inverter 110 can be designed to trip at a predetermined voltage to set the point at which the capacitor 102 will begin charging. This provides the technical advantage of allowing the design to define the optimum period in which the capacitor is charged. In the preferred embodiment, the inverter 110 is set to trip at a voltage which is one V$_T$ below V$_{cc}$.

After the signal at the output node 122 has stabilized at V$_{cc}$, the boot signal 72 is switched from low to high in order to implement the boot stage 16. A high boot signal 72 causes a low voltage output of the inverter 74, thus placing the P-channel transistor 80 in a conducting state. Simultaneously, the high boot signal 72 at the second input 120 of the NOR gate 114 causes the output 116 to switch from high to low, thereby turning the N-channel transistor 98 off. With the N-channel transistors 86 and 98 turned off, and the P-channel transistor 80 turned on, the voltage at the lower plate 100 of the capacitor 102 is switched from low to high. Since the capacitor 102 will resist a change in voltage between its plates 100 and 106, the voltage at plate 106 is increased in response to the voltage change at the lower plate 100. The rise in voltage at the upper plate 106 causes the voltage at the output node 122 to increase, thus completing the booting stage 16.

Figure 4:
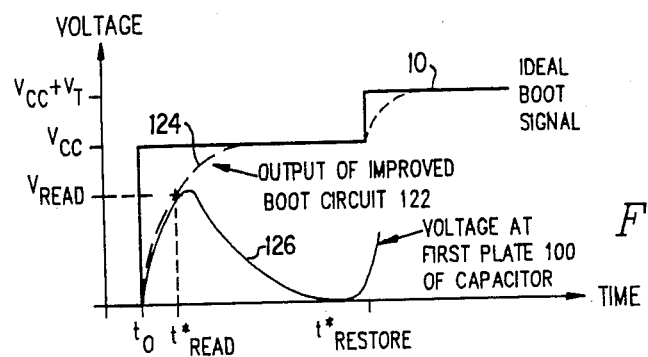
FIG. 4 illustrates the output of the high speed boot circuit in comparison with the ideal output signal.

Referring now to FIG. 4, the output of the high speed boot circuit of the present invention is illustrated. As the read signal 18 switches from high to low to start the read state 14, both the output node voltage 124 and the lower plate voltage 126 rise quickly to a voltage slightly above V$_{read}$. At this point, sufficient voltage is available at the output node 122 to read the contents of the address memory cell. Since the capacitor 102 is not being charged during this interval, the output node voltage 124 rises much more quickly than in the standard boot circuit, therefore t*$_{read}$ of the high speed circuit 52 is much faster than t$_{read}$ in the standard boot circuit 17. After V$_{read}$ has been reached, the lower plate 100 is connected to ground through the N-channel transistor 98. As the voltage at the lower plate is pulled low, a full charge is being developed across the plates of the capacitor 102. When the boot signal 72 switches, the voltage at the lower plate 100 is increased as the P-channel transistor 80 connects the power supply voltage to the lower plate 100. Consequently, the output node voltage 124 also rises, thus implementing the boot state 16.

The time period between t*$_{read}$ and t*$_{restore}$ in the high speed boot circuit 52 is the same as for the standard boot circuit 17. However, since t*$_{read}$ is smaller than the t$_{read}$ of the standard boot circuit 17, t*$_{restore}$ is correspondingly smaller.

Figure 5:
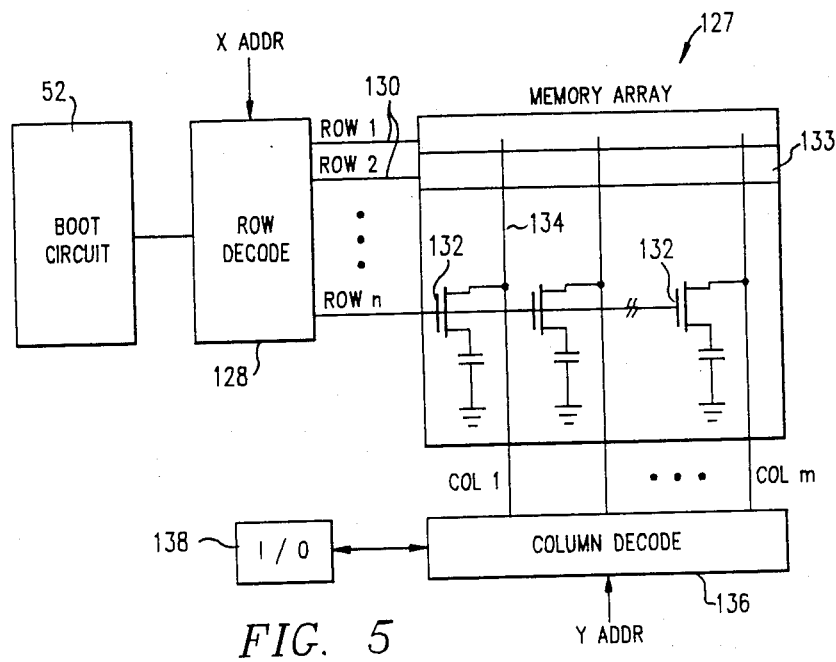
FIG. 5 illustrates the high speed boot circuit of the present invention used in an embodiment of a dynamic memory.

FIG. 5 illustrates the high speed boot circuit 52 of the present invention as used in one embodiment of a dynamic memory 127. The high speed boot circuit 52 is connected to a row decode 128. The row decode 128 connects the output of the high speed boot circuit 52 to one of N wordlines 130 based upon an "X" address. The wordlines 130 are connected to rows of memory cells 132 in a memory array 133. Bitlines 134 are connected to columns of the memory cells 132. A column decode 136 connects one of M wordlines to an I/O circuit 138 based on a "Y" address. The construction and operation of the DRAM array is known and described in prior patents such as U.S. PAT. No. 4,533,843.

Although a preferred embodiment of the invention has been described in detail, it should be understood that the various changes, substitutions and alterations can be made therein without departing from the spirit and scope of the invention as defined by the appended claims.

What is claimed is:

1. A circuit for producing an output signal to drive the wordline of a random access memory cell, the output signal having a first transition from a low voltage state to a high voltage state and a second transition from the high voltage state to a boosted voltage state above the high voltage state in response to a boot signal, comprising:

input circuitry comprising a transistor for generating an input signal, said input signal having a transition from a low voltage state to a high voltage state;

circuitry for connecting the boot signal to said switching circuitry such that said input circuitry is disconnected from said output node after the boot signal is generated;

switching circuitry for connecting said input circuitry to an output node;

said second plate being disconnected from said circuit at least until said output node has reached a voltage level sufficient to read from the memory cell;

a capacitor having first and second plates, said first plate connected to said output node;

precharge circuitry for connecting said second plate to a low voltage prior to generating said input signal;

disconnecting circuitry for operably disconnecting said second plate from the circuit until after said input signal reaches said high voltage state such that said capacitor is not charged by said input signal until after said high voltage state is reached;

said disconnecting circuitry operable to connect said second plate to a predetermined voltage in response to detecting the boot signal, such that the voltage rises on said second plate in response to said predetermined voltage to cause a rise in voltage at said first plate, thereby generating the transition from the high voltage state to the boosted voltage state at said output node;

said disconnecting circuitry further operable to connect said second plate to a low voltage after said input signal has reached a high voltage state in order to develop a charge across said first and second plates; and means for limiting current between said second plate and said low voltage in order to control the rate at which said capacitor is charged.

2. The circuit recited in claim 1 wherein said disconnecting circuitry comprises:
   a first transistor connected to said second plate, said first transistor operable to apply a high voltage to said second plate when the boot signal is high; and
   a second transistor connected to said second plate, said first transistor operable to connect a low voltage to said second plate when the boot signal is low and said output node has surpassed a predetermined voltage level.

3. Apparatus for driving a wordline of a dynamic random access memory, comprising:
   means for generating a signal having a low voltage state and a high voltage state;
   means for passing said signal to a circuit output;
   a capacitor having a first plate connected to said output and a second plate connected to receive a low voltage;
   means for charging said capacitor from said signal after said signal has reached said high voltage state, including a connection between said output and said first plate;
   a switch between said second plate and said low voltage, such that said low voltage is disconnected from said second plate prior to said signal reaching said high voltage; and
   means for applying a predetermined voltage to said second plate of said capacitor such that the voltage at said second plate rises above a high voltage state.

4. The apparatus of claim 3 wherein said means for applying a voltage comprises:
   a switch between said second plate and said predetermined voltage; and
   means for connecting a boot signal to said switch, said switch operable to connect said predetermined voltage to said second plate when said boot signal reaches a predetermined voltage level.

5. The apparatus of claim 3 wherein said switch comprises a transistor.

6. The apparatus of claim 4 wherein said switch comprises a transistor.

7. The apparatus of claim 3 and further comprising means for limiting the current from said second plate to said low voltage, such that said second plate discharges at a predetermined rate.

8. The apparatus of claim 7 wherein said means for limiting comprises a transistor having a predetermined channel width.

9. A circuit for producing an output signal to drive the wordline of a random access memory cell, the output signal having a low voltage state, a high voltage state, and a boosted voltage state above the high voltage state, comprising:
   input circuitry for generating an input signal having a low voltage state and a high voltage state;
   boot circuitry for generating an input signal having a low voltage state and a high voltage state;
   a first transistor operable to pass said input signal to an output node while said boot signal is in said low voltage state;
   a capacitor having first and second plates, said first plate connected to said output node;
   a second transistor connected to said second plate, said second transistor operable to apply a high voltage to said second plate when said boot signal is in a high voltage state;
   a third transistor connected to said second plate, said third transistor operable to conduct a low voltage to said second plate when said boot signal is in a low voltage state and after the voltage level of said output node has surpassed a predetermined level;
   a voltage level detector having said output node connected to its input;
   a NOR gate having said boot circuitry and the output of said voltage level detector connected to its inputs;
   said NOR gate connected to said third transistor such that said transistor is in a conducting state when the output of said NOR gate is in a low voltage state.

10. The circuit of claim 9 wherein said voltage level detector is a predetermined high voltage level detector inverter circuit.

11. A dynamic memory wherein:
   a plurality of wordlines are connected to a plurality of memory cells, the memory cells each operable to output data stored within when a corresponding wordline has a first voltage and operable to restore the data in said cell when said wordline has a second voltage, the memory comprising:
   input circuitry for generating the first voltage;
   switching circuitry for connecting said input circuitry to a corresponding wordline;
   a capacitor having first and second plates, said first plate connected to a corresponding wordline;
   disconnecting circuitry for operably connecting said second plate to a predetermined voltage source, and for disconnecting said second plate from said predetermined voltage source such that said second plate varies in voltage according to changes in voltage at said first plate when said second plate is in a disconnected state;
   booting circuitry for generating a boot signal indicating a desired transition to said second voltage;
   said disconnecting circuitry operable to disconnect said second plate from said predetermined voltage source during a transition from a low voltage to said first voltage, such that said capacitor does not load said corresponding wordline during said transition; and
   said disconnecting circuitry operable to connect said second plate to said predetermined voltage source after said boot signal is generated in order to increase the voltage present at said second plate, causing the voltage at said first plate and said corresponding wordline to rise to said second voltage.

12. The memory of claim 11 and further comprising circuitry to drain charge present at said second plate to ground prior to generation of said first voltage.

13. The memory of claim 11 wherein said booting circuitry is connected to said switching circuitry, said switching circuitry disconnecting said input circuitry from said corresponding wordline after generation of said booting signal.

14. The memory of claim 11 wherein said second plate is disconnected from said predetermined voltage source until said corresponding wordline reaches a minimum voltage at which data can be read from said memory cell.

15. The memory of claim 11 and further including discharging circuitry for connecting said second plate to ground after said wordline reaches a minimum voltage at which data can be read from said memory cell.

16. The memory of claim 15 wherein said discharging circuitry comprises a logic element for connecting said second plate to ground when said boot signal is present and said wordline has reached a predetermined voltage.

17. The memory of claim 15 wherein said discharging circuitry comprises:
 a NOR gate having one input connected to said boot signal;
 an inverter having an input connected to said corresponding wordline and an output connected to an input of said NOR gate; and
 a transistor having a gate connected to the output of said NOR gate, such that said transistor conducts from ground to said second plate when the output of said NOR gate is high.

18. A dynamic memory cell as recited in claim 11 wherein said boot signal causes said second plate to be connected to the power supply voltage.

* * * * *